United States Patent [19]

Patterson

[11] 3,787,718

[45] Jan. 22, 1974

[54] SPHERICAL ELECTRONIC COMPONENTS

[75] Inventor: James A. Patterson, Santa Clara, Calif.

[73] Assignee: Sondell Research & Development Co., Palo Alto, Calif.

[22] Filed: Aug. 8, 1972

[21] Appl. No.: 280,001

Related U.S. Application Data

[62] Division of Ser. No. 731,241, May 22, 1968, abandoned.

[52] U.S. Cl....... 317/234 R, 317/235 M, 317/234 E, 317/234 Q, 317/234 S, 317/234 T, 338/99, 117/215

[51] Int. Cl........................... H01l 5/00, H05b 33/00

[58] Field of Search.... 117/215; 317/235 M, 234 E, 317/234 Q, 234 S, 234 T; 338/99, 100

[56] References Cited

UNITED STATES PATENTS

| | | | |
|---|---|---|---|
| 3,386,067 | 5/1968 | Costanzo | 338/100 |
| 3,125,739 | 3/1964 | Deibel | 338/99 |
| 3,437,973 | 4/1969 | Mallett | 338/99 |
| 3,629,774 | 12/1971 | Crites | 338/114 |
| 2,258,958 | 10/1941 | Pearson | 201/72 |
| 3,319,141 | 5/1967 | Carion | 317/258 |
| 3,243,753 | 3/1966 | Kohler | 338/31 |
| 2,951,817 | 9/1960 | Myers | 252/511 |
| 3,179,634 | 4/1965 | Edwards | 260/78 |

*Primary Examiner*—Martin H. Edlow
*Attorney, Agent, or Firm*—Townsend and Townsend

[57] ABSTRACT

Electronic components are constructed from a solid spherical core of electrically nonconducting material such as a stabilized cross-linked copolymer plastic. The spherical core is coated with a plurality of concentric electrically functional layers to provide a variety of electronic components such as resistors and capacitors having pressure sensitive electrical characteristics. More complex electronic components such as transistors, thermistors, rectifiers and thermocouples may be provided depending upon the configuration and composition of concentric layers on the spherical core. A plurality of spheres may be combined in a pressure chamber to provide a variety of transducers and detectors such as a pressure transducer, photosensitive detector, infrared detector or memory cell bank.

7 Claims, 6 Drawing Figures

PATENTED JAN 22 1974 3,787,718

SPHERICAL ELECTRONIC COMPONENTS

This is a division of application Ser. No. 731,241, filed May 22, 1968, now abandoned.

This invention relates to an entirely new and improved class of electronic components useful individually as microelectronic circuit elements and useful in combination to provide a variety of transducers and detectors.

According to the present invention, electronic components are formed from a microspherical non-conducting plastic core having high elasticity. The core is coated with an electrically conductive concentric layer of metal such as copper and the metal layer is in turn coated with a highly resistive non-electrically conducting material. With a multitude of spheres so formed packed into a pressure chamber with metal electrodes at each end of the chamber, a circuit of high resistance is established through the pack. In the most dense packing of spheres, each sphere is in contact with 12 other spheres, six in the same sphere layer and three in each of the two adjoining layers. As the pressure is increased in the pressure chamber by a piston, the outer resistive layer of each sphere at the points of contact with other spheres is reoriented and redistributed so that the resistance at each contact point is reduced thereby resulting in an increase in current through the pack of spheres. Each sphere, contacting 12 other spheres, can provide the equivalent electrical effect of 12 resistance elements in parallel. Because of the elasticity of the materials used, the spheres have total recovery when the pressure is released.

A single microsphere resistor formed as described above may be used individually as a resistance element in a microelectronic circuit such as a printed circuit. The microspherical resistance component is supported within a hole of lesser diameter than the diameter of the sphere. The size of the hole is chosen to provide a range of pressures on the sphere depending upon the extent to which the microspherical reistor is pressed into the hole. The extent of pressure on the sphere determines the resistance exhibited by the sphere in the printed circuit so that the resistance can be varied by applying different pressures to the sphere. Electrodes on either side of the hole provide the leads to the resistor.

A condensor according to the present invention is constructed by coating the microspherical plastic core with concentric layers of metal separated by an insulating layer and with electrical contacts to each metallic layer. The spherical capacitor may be similarly mounted in a mounting hole in a circuit board with the inner metallic layer exposed to contact the first electrode on one side of the hole and with the outer metallic layer contacting a second electrode on another side of the hole.

When one of the spherical plastic cores is coated with a concentric layer of electrically conducting material such as metal, and a second layer of a highly resistive nonconductive monomeric material such as cupreous or cupric oxide, the sphere so formed serves as a photosensitive element. A multitude of such elements packed in a pressure chamber provides a photosensitive detector. Similarly, if the outer coating of the sphere is in an infrared sensitive material such as lead sulfide, the element is infrared sensitive and a plurality of such spheres packed under pressure between electrodes provides an infrared detector.

It has also been found that a plurality of spherical resistors formed as described above and supported under pressure between electrodes retains an electrical voltage impressed on the metallic layers even though the electrodes be grounded or shorted out. As long as the pressure is maintained, the impressed voltage is retained or remembered until the pressure is released. It has also been found that while the spheres are under pressure different spheres will retain different impressed voltages applied to the respective metallic layers even though all the spheres are grounded together. The spheres may thus be used in combination to provide a memory cell bank.

The spherical plastic core may be provided with other coatings such as P and N type semiconducting material with suitable electrode connections to the various layers to provide rectifiers, transistors or light-emitting diodes. Similarly, thermistors and thermocouples of spherical geometry may be provided by utilizing appropriate coatings.

Other features of the present invention will become apparent in the following specification and accompanying drawings.

Figure 1:
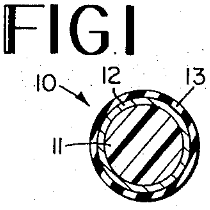
FIG. 1 is a cross-sectional view of a spherical electronic component embodying the present invention.

In the embodiment of the present invention illustrated in FIG. 1, there is provided an electronic component 10 including a small spherical non-conducting plastic core 11 having high elasticity. The plastic core may be formed of a stabilized cross-linked copolymer plastic such as divinylbenzene and styrene. The plastic core is then coated with a concentric layer 12 of a conductive metal such as copper. The conductive metal layer is then in turn coated with a concentric layer 13 of a resistive non-electrically conducting material.

Figure 2:
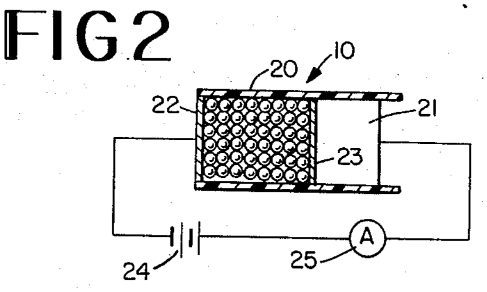
FIG. 2 is a diagrammatic view of a detector embodying the present invention.

When a plurality of spherical electronic components 10 so formed are placed in a pressure cylinder 20 as illustrated in FIG. 2, a pressure sensitive transducer is provided. The spheres 10 are packed within the cylinder so that each sphere is in contact with 12 other spheres and pressure is applied to the pack of spheres by a piston 21. Naturally, spherical packings of other densities can be employed. Electrodes 22 and 23 are provided at each end of the pressure cylinder 20 in contact with the spheres 10 and a closed circuit is provided between the electrodes including a voltage source 24 and an ammeter 25. When no pressure is applied by the piston 21 against the pack of spheres 10, the spheres provide a high resistance in the closed circuit. As pressure is applied against the pack of spheres by the piston 21, the outer resistive layer 13 of each sphere at points of contact is reoriented and redistributed so that the resistance at each contact point is reduced thereby increasing the current in the circuit as indicated by the ammeter 25. The current passing through the circuit provides a measure of the pressure applied by piston 21, thus providing a pressure sensitive transducer. Because of the materials used in the spherical electronic components, the spheres have total recovery after the pressure is released.

Because of the deformation of the sphere under pressure, it is necessary that the surface of the plastic polymer spherical core be metallized with an intimate chemical bond between the plastic and the metal atoms in order to avoid rupture of the thin metal shell or layer 12. The plastic spherical core can be metallized by developing an ionic or conductive layer on the surface of the polymer as by a controlled depth sulfonation reaction. Sulfonation to a maximum depth of 1/10th radius of the polymer core has been found satisfactory. The minimum depth of sulfonation is determined by the desired surface conductivity. The plastic core can be formed of any water insoluble polymer to which surface ionic groups can be attached such as sulfonate ions, phosphate ions, and various other cations and anions. The conductive metal layer 12 such as copper can then be deposited on the ionic surface of the polymer core by electrolysis. The controlled depth of ionization of the polymer core 11 prevents water swelling of the core. The conductive metal layer can be entirely copper, or after a starting layer of copper has been deposited, a second metal layer of another metal such as nickel, gold, silver, cobalt, iron, etc. can be coated on the electrolytically deposited copper as by flashing to provide a metal-to-metal bond. The resultant bonding between the metal and polymer core will then endure deformations of the spherical electronic component.

Other examples of metallizing polymer spheres according to the above method are set forth in patent applications Ser. No. 613,136 filed Feb. 1, 1967, and Ser. No. 619,964 filed Mar. 2, 1967, in which I am a coinventor and which are assigned to the same assignee as the present invention.

Figure 3:
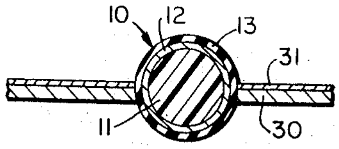
FIG. 3 is a fragmentary side cross-sectional view of the spherical electronic component illustrated in FIG. 1 mounted in a microelectronic circuit.
Figure 4:
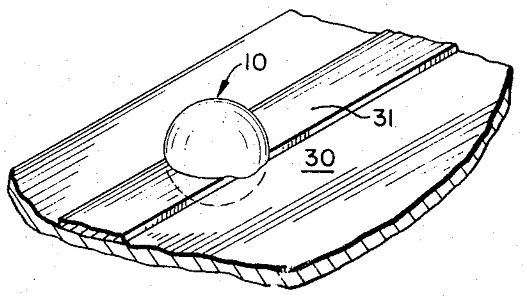
FIG. 4 is a fragmentary perspective view of the spherical electronic component and microelectronic circuit illustrated in FIG. 3.

As illustrated in FIG. 3, a single spherical resistor as formed above may be utilized in a microelectronic circuit such as a printed circuit board 30. A mounting hole is provided in the circuit board and the spherical resistor 10 is wedged into the hole a predetermined distance to provide a sufficient pressure on the resistor so that it exhibits a desired resistance in the circuit. As shown in FIG. 4, electrodes and connecting leads 31 are provided at each side of the hole in the circuit board 30 contacting the outer layer of the spherical resistor 10. The resistance of the component can be varied by varying the depth to which the sphere is wedged into the hole and thereby the pressure exerted on the sphere and the amount of resistance in the circuit read as the component is pressed into the hole so that the desired resistance is achieved.

When the outer resistive layer 13 is formed of a nonconductive monomeric material such as cupreous or cupric oxide, the electronic component serves as a photosensitive element. When a plurality of such elements are packed under pressure as illustrated in FIG. 2, a photosensitive detector is provided. Thus, with the photosensitive spheres packed in the cylinder 20, the current through the closed circuit as measured by ammeter 25 provides a measure of the light incident on the spheres 10. The outer layer 13 of cupreous or cupric oxide can in turn be enclosed by a transparent protective coating. Instead of the cupreous or cupric oxide, other materials having photoconductive characteristics such as germanium, selenium, selenides and tellurides can be used for the layer 13 which concentrically encloses the metal layer 12. The layer 13 having photoconductive characteristics can be protected by a transparent conducting film such as a metallic lacquer sprayed onto the surface. A variety of metals can be used for the conducting metallic layer 12. In combination in the clyinder 20, a plurality of such spheres provide a photoconductive cell.

By choosing an infrared sensitive material such as lead sulfide for the layer 13 on the spherical electronic component illustrated in FIG. 1, the component will serve as an infrared detector. A plurality of such spheres can be packed in the pressure cylinder 20 as illustrated in FIG. 2 to provide an infrared detector. Such a pack of infrared sensitive spheres can be used as an infrared energy antenna for application in such devices as personnel detectors and sensors.

Figure 5:
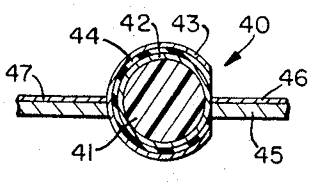
FIG. 5 is a cross-sectional view of a spherical capacitor embodying the present invention and mounted in a microelectronic circuit board.
Figure 6:
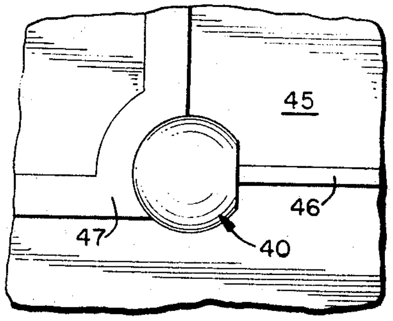
FIG. 6 is a plan view of the spherical capacitor and circuit board illustrated in FIG. 5.

Referring now to FIGS. 5 and 6, a spherical capacitor 40 can be constructed according to the present invention by providing a plastic core 41 having concentric layers 42 and 43 of a conductive metal separated by an insulating dielectric layer 44, and electrical contacts to each metal layer as illustrated in FIG. 5. By way of example, aluminum layers 42 and 43 can be provided coated in the manner described above and separated by a dielectric layer of polystyrene. At one side of the sphere the inner metallic layer 41 can be exposed as by lapping to provide an electrical contact of the inner layer. Alternatively, if the outer layers 43 and 44 are applied while the core 41 coated with the first metal layer 42 is resting on a flat surface, the first metal layer will remain uncovered at the position in contact with the surface. As illustrated in FIG. 5, a single spherical capacitor 40 can be mounted as an element in a printed circuit board 45 provided with a hole in which the capacitor is mounted. An electrode and connecting lead 46 on one side of the hole contacts the inner metallic layer while one or more other leads 47 contact the outer metallic layer 43.

A variety of other spherical electronic components can be provided according to the present invention by selection of various materials forming the outer concentric electrically functional layers. Thus, the spherical polymer core can be coated with a metal layer as described above. The metal layer can be in turn coated with either N or P type semiconducting material having electronic characteristics to provide a rectifier. Suitable electric connections are provided to the respective layers of metal and semiconducting material. By building up successive concentric layers of P type and N type semiconducting material, more complex electronic components such as transistors can be provided. The alternating P type and N type concentric layers can be formed directly on the spherical polymer core or formed secondarily on a metallic layer around the core.

For the concentric electrically functional semiconductor layers, material such as gallium arsenide (GaAs) can be used to provide a light-emitting diode.

To further illustrate the teachings of the present invention, a thermistor can be constructed according to the present invention by coating a spherical plastic core with a concentirc layer of a metallic conductor such as platinum in the manner described above. The metallic layer is then coated with a ceramic material such as an oxide of manganese, nickel, cobalt, copper, uranium, zinc, titanium, magnesium, etc. The ceramic material is in turn coated with an outer concentric conducting layer of a metal such as platinum. With electrical contacts suitably provided to the metallic layers, a thermistor is provided whose resistance value varies with temperature in a desired manner. Electrical contacts can be provided by exposing the inner metallic layer in the manner described with respect to the capacitor illustrated in FIG. 5.

A thermocouple can be provided by coating the spherical plastic core with concentric layers of a relatively positive conducting element and a relatively negative conducting element separated by an insulator. Thus, the inner conducting layer may be a composite of platinum and rhodium, or chromel D, iron, or copper, while the outer conductive layer may be formed of platinum, alumel or constantan.

It has been found that when spherical resistors constructed according to FIG. 1 are supported under pressure as in FIG. 2 and an electrical voltage impressed on the metallic layers, the voltage will be retained by each cell or spherical component even though the cell is grounded or shorted out. Furthermore, as long as the pressure is maintained, different spheres will retain different voltages respectively impressed across the different spheres and the different respective impressed voltages are retained even though the spheres are grounded together thus providing a memory bank. When the pressure is reduced and the cells grounded, the memory is lost. In addition, while the spheres are retained under pressure, an increase of voltage across a given cell or sphere in the pack will be retained as increased voltage on the sphere.

In each of the above described embodiments of the present invention, the parameters and characteristics of the spherical electronic components are pressure sensitive and the components may be used either alone in microelectronic circuits or packed in combination to provide a variety of transducers and detectors.

While only certain embodiments of the present invention have been shown and described, other adaptations and modifications would be apparent without departing from the true spirit and scope of the following claims.

In the claims:

1. An electronic component comprising a solid compressible elastic spherical core member of electrically non-conductive material, an ionic type adherent material bonded to the surface of said core; a first electrically functional layer substantially concentric about said core; and a second electrically functional layer at least partially surrounding said first layer wherein said first electrically functional layer comprises a semiconducting material which is in contact with said ionic type adherent material and wherein said second electrically functional layer comprises a semiconducting material having electronic characteristic opposite that comprising the first layer wherein said second electrically functional layer is in contact with said first electrically functional layer.

2. Electronic component as set forth in claim 1, wherein there is also provided a third electrically functional layer comprising a layer of semiconducting material having electronic characteristics similar to that of the material comprising the first electrically functional layer and in contact with said second electrically functional layer.

3. An electronic component as set forth in claim 1, wherein said layers of semiconducting material comprise a light-emitting diode.

4. An electronic component comprising: a solid compressible elastic spherical core member of electrically nonconductive material; an ionic-type adherent material bonded to the surface of said core; a first electrically functional layer substantially concentric about said core; and a second electrically functional layer at least partially surrounding said first layer, wherein said first layer is a metallic electrically conducting material which is in contact with said ionic type adherent material and said second layer is formed of a semiconducting material which is in contact with said first electrically functional layer.

5. An electronic component as set forth in claim 4, wherein there is also provided a third electrically functional layer at least partially concentrically surrounding said second electrically functional layer and wherein said third electrically functional layer comprises a semiconducting material having electronic characteristics opposite that of the material comprising the second electrically functional layer and said third electrically functional layer in contact with said second electrically functional layer.

6. An electronic component comprising: a solid elastic spherical core of electrically non-conducting material; a first layer of semiconducting material concentrically surrounding and in contact with said core; and a second layer of semiconducting material having electronic characteristics opposite that of the first layer, at least partially surrounding and in contact with said first layer.

7. An electronic component as set forth in claim 6, wherein there is provided a third layer of semiconducting material having electronic characteristics opposite that of the second layer, at least partially surrounding and in contact with said second layer.

* * * * *